United States Patent

[11] 3,621,344

[72] Inventors William M. Portnoy
4227 53rd St., Lubbock, Tex. 79413;
Hayden M. Leedy, Jr., 1616 Westridge,
Plano, Tex. 75074

[21] Appl. No. 686,984
[22] Filed Nov. 30, 1967
[45] Patented Nov. 16, 1971

[54] TITANIUM-SILICON RECTIFYING JUNCTION
3 Claims, 3 Drawing Figs.

[52] U.S. Cl. .......... 317/234, 317/235, 29/576
[51] Int. Cl. .......... H01l 5/00, H01l 7/02
[50] Field of Search .......... 317/234, 235, 236–241

[56] References Cited

UNITED STATES PATENTS

| | | | |
|---|---|---|---|
| 2,713,133 | 7/1955 | Ostapkovich | 317/236 |
| 3,333,324 | 8/1967 | Roswell et al. | 317/235 X |
| 3,335,338 | 8/1967 | Lepselter | 317/234 |
| 3,451,912 | 6/1969 | D'Heurle et al. | 317/235 X |
| 3,290,127 | 12/1966 | Kahng | 317/235 X |
| 3,463,975 | 8/1969 | Biard | 317/235 |
| 3,476,984 | 11/1969 | Tibal | 317/234 |

*Primary Examiner*—James D. Kallam
*Attorneys*—Samuel M. Mims, Jr., James O. Dixon, Andrew M. Hassell, Harold Levine, Melvin Sharp, John E. Vandigriff and James C. Fails

ABSTRACT: Disclosed is a metal semiconductor rectifying junction comprising a layer of titanium metal in electrical contact with a silicon surface.

HAYDEN M. LEEDY JR.
WILLIAM M. PORTNOY
INVENTORS

BY Nelson Sharp

ATTORNEY

TITANIUM-SILICON RECTIFYING JUNCTION

This invention relates generally to semiconductors and more particularly to metal semiconductor rectifying junctions.

Rectifying junctions formed by intimately contacting certain metals with certain semiconductors are finding widespread applications in devices for high-frequency electronic circuits. The metals most commonly used in the electronic industry today to make metal semiconductor rectifying junctions are molybdenum and aluminum. One such application for a metal semiconductor rectifying junction is in a Schottky-barrier diode used as the diode in an X-band mixer circuit for microwave application. Such a mixer diode requires a low series resistance and a low forward voltage. Although molybdenum-silicon diodes are widely used for this purpose, better circuit performance could be achieved with lower series resistance and lower forward voltage than is obtainable with these diodes.

Accordingly, an object of this invention is a metal semiconductor junction which minimizes series resistance.

Another object of this invention is a metal semiconductor junction having a lower forward voltage than diodes commercially available.

The novel features believed to be characteristic of this invention are set forth with particularity in the appended claims. The invention itself, however, as well as further objects and advantages thereof may best be understood by reference to the following detailed description when read in conjunction with the accompanying drawing wherein:

Briefly, the invention involves a titanium-silicon rectifying junction formed by the intimate contact of titanium to silicon. When titanium is placed in contact with a silicon surface, the titanium reacts with the thin layer of silicon oxide of approximately 50 A. in thickness that is always found on an otherwise clean surface of a silicon substrate. By reacting with and absorbing the oxygen from this thin layer of silicon oxide, a more intimate metal to semiconductor contact is achieved than is possible with less reactive metals, such as molybdenum, resulting in almost zero series resistance. The titanium-silicon rectifying junction has good forward and reverse characteristics, with a reverse breakdown voltage of about 2 volts at 100 microamperes, and a forward voltage of about 0.2 volt at 1 milliampere as compared to the reverse breakdown voltage of about 10 to 15 volts at 100 microamperes and a forward voltage of about 0.5 volt at 1 milliampere for a molybdenum-silicon rectifying junction. Both the low series resistance and low forward voltage of the titanium-silicon rectifying junction are an advantage in a diode, especially when the junction is used for a mixer diode in an X-band microwave circuit.

Figures 1, 2:
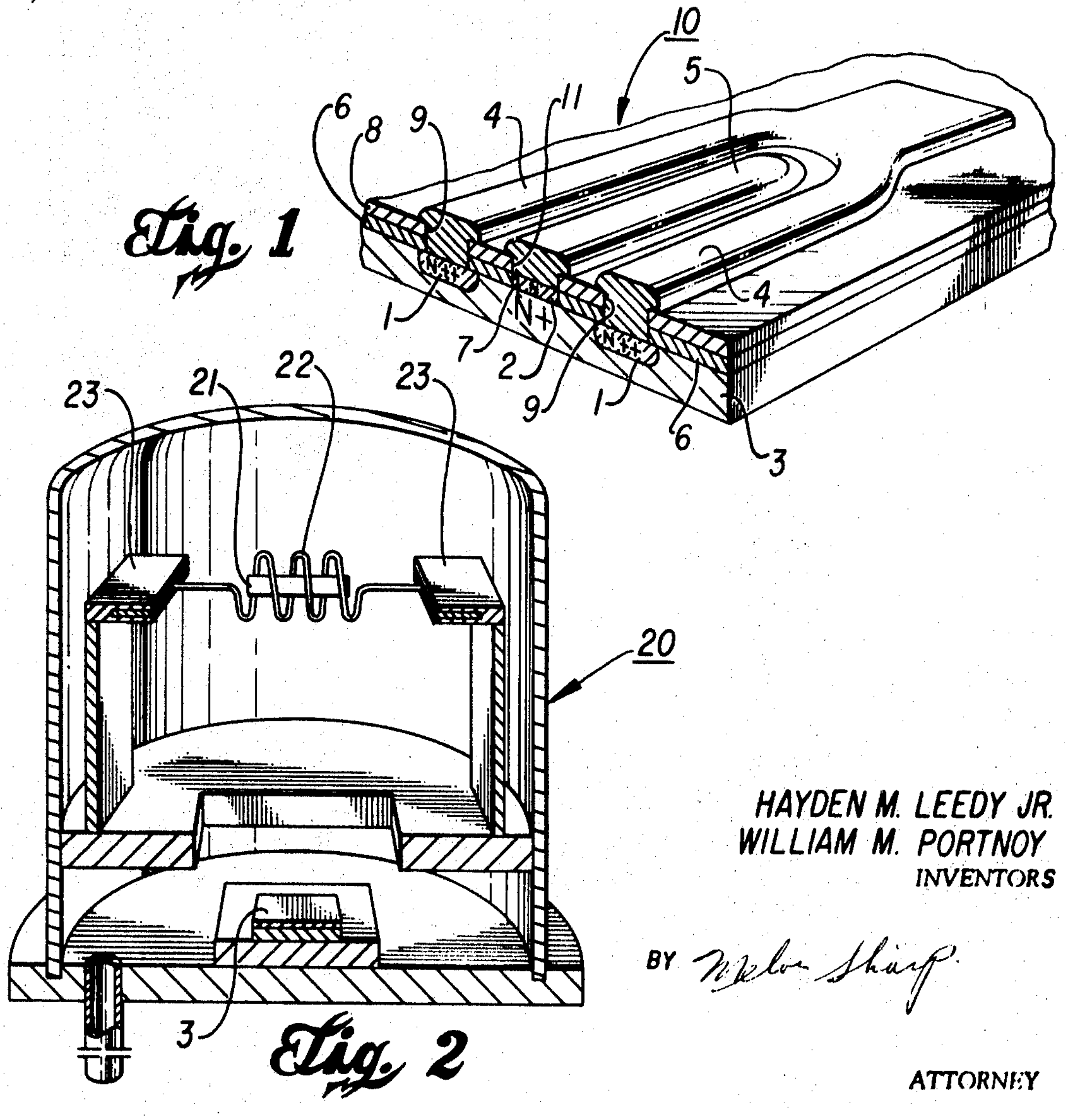
FIG. 1 is a pictorial view, partly in section, illustrating a surface-oriented diode using titanium to make both rectifying and ohmic contacts to a silicon substrate.
FIG. 2 is a pictorial view, partly in section, illustrating a conventional evaporator used to deposit the titanium for the contacts shown in FIG. 1.

Referring now to the FIGURES of the drawing, there is illustrated in FIG. 1 a surface-oriented Schottky-barrier diode 10. Only one method of fabricating the diode 10 is described for illustrative purposes and is not meant to limit the invention in any way. The N++ type regions 1 and the N-type region 2 in the N+ type silicon substrate 3 are formed by conventional epitaxial deposition and diffusion methods.

As the first step in the formation of the diode 10, a thin layer of silicon oxide 6 is formed on the surface of the N+ type silicon substrate 3 having a resistivity of about 0.008 to 015 ohm-cm. to a thickness of about 4,000 A. by any conventional method, such as thermal growth or pyrolytic deposition. An opening 7 is formed in the silicon oxide layer 6 by conventional photolithographic and etch methods to expose a portion of the substrate 3. The opening 7 is filled with N-type silicon material 2 having a resistivity of about 0.025–3 ohm-cm., (between 1 to 2 ohm-cm. being the preferred resistivity) by conventional epitaxial deposition methods. A second silicon oxide layer 8 is deposited pyrolitically on the first silicon oxide layer 6 and the N-type material 2 to a thickness of about 8,000 A. followed by formation of the apertures 9 by conventional photolithographic and etch methods in both silicon oxide layers 6 and 8 to expose portions of the substrate 3. By using conventional diffusion methods, an N-type impurity is diffused into the portion of the substrate surface exposed by the apertures 9 to form the N++ type regions 1 having resistivities of less than about 0.005 ohm-cm. By conventional photolithographic and etch methods, the apertures 9 are reopened to remove the layer of oxide formed during the diffusion operation and the opening 11 is formed to expose the region 2.

During the fabrication of all silicon devices there is formed a thin layer of silicon oxide of approximately 50 A. on the surface of the silicon. This layer of silicon oxide is impossible to prevent whenever a silicon surface is exposed to an air ambient, even at room temperature. The necessary precautions of excluding air during the subsequent steps of device fabrication until the contacts are formed is practiced only in the formation of laboratory devices. Such precautions are not practical and are not followed during the fabrication of commercial devices. Therefore, there exists a thin layer of silicon oxide between any metal contact and a silicon surface on any commercial silicon device. Silicon oxide, being an electrical insulator, forms a layer having electrical resistance between the metal contact and the silicon substrate. Titanium, however, on contact with an oxide surface, has the characteristic of absorbing oxygen from the oxide so that when a layer of titanium is applied on the surface of a silicon substrate with an intermediate layer of silicon oxide, the titanium reacts with the oxygen of the silicon oxide to form titanium oxide. In turn, titanium oxide breaks down with the oxygen diffusing into the mass of the titanium metal. Since the amount of titanium metal is so great compared to the amount of oxygen absorbed the resistivity of the titanium metal is unaffected by the absorption of the oxygen. It is possible, therefore, when using titanium as a contact material, either ohmic or rectifying, to form an almost zero series-resistance contact.

To form a layer of titanium on the substrate 3 of FIG. 1 the substrate 3 is placed on a support in a conventional evaporator 20 as shown in FIG. 2. A charge 21 i of titanium is placed inside a tungsten coil 22 that is connected to two electrical contacts 23 which are in turn connected to a power supply (not shown) located outside the evaporator. A vacuum of approximately $5\times10^{17}$ millimeters of mercury is pulled on the evaporator 20. The tungsten coil 22 is heated by the outside power source until the titanium charge 21 reaches a temperature of approximately 2,400° C., at which temperature the titanium evaporates and deposits on the silicon substrate 3. During the evaporation of the titanium the silicon substrate 3 remains approximately at room temperature. The evaporation of the titanium is continued by maintaining the temperature of the charge 21 at about 2,400° C. for a period of time sufficient to deposit a layer of titanium on the surface of the silicon substrate 3 of sufficient thickness to have low electrical resistance. After the desired thickness of titanium is obtained the tungsten coil 21 is cooled and the evaporator is returned to atmospheric pressure to allow the titanium covered substrate 3 to be removed from the evaporator.

The titanium layer is covered with a photoresistive material, such as KMER, manufactured by Eastman Kodak Company, Rochester N.Y. and patterned by exposure to a pattern of light. The unpolymerized portions of the KMER are removed to expose the surface of the titanium layer except the portions required to form the rectifying and ohmic contacts 5 and 4, respectively, as shown in FIG. 1. The exposed portions of the surface of the titanium layer and the layer of KMER are subjected to a wet chemical etch, including as its constituents, water, hydrochloric if and nitric acid, for a period of time sufficient to form the contacts 4 making ohmic connections to the N++ type regions 1 and the contact 5 making a rectifying connection to the N-type region 2. Although it is not shown in FIG. 1, a top layer of metal, such as gold or aluminum, can be formed by conventional methods on the contacts 4 and 5 to facilitate subsequent ball bonding of lead wires to the contacts. Electrical connections are made to the diode 10 by bonding gold wires, for example, to the contacts 4 and 5 if the diode is an individual device or the contacts 4 and 5 are extended to make electrical connections to the remainder of the circuit if the diode is a component of a monolithic integrated circuit.

Although a surface oriented diode we was described to illustrate one typical use of the titanium-silicon rectifying junction, it is obvious that other configurations and devices can be made using the titanium-silicon rectifying junction. For example, a diode could be formed with the titanium-silicon rectifying junction on one side of a silicon substrate with the ohmic contact being made to the opposite side of the substrate. In addition, the rectifying junction of the invention can be used as one junction of a transistor.

Figure 3:
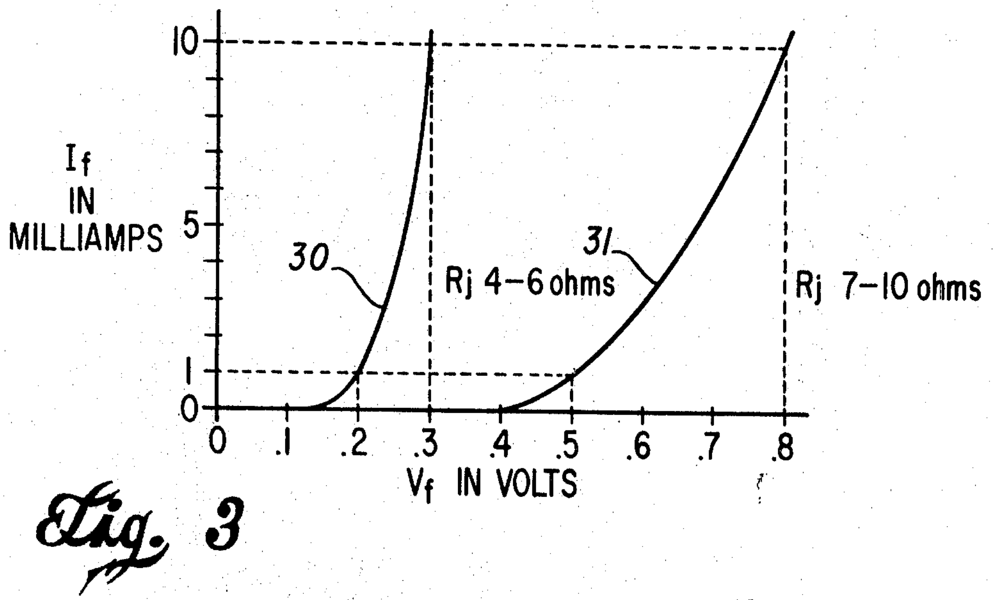
FIG. 3 is a graph, illustrating the forward current versus forward voltage of a typical titanium-silicon rectifying junction compared to a comparable molybdenum-silicon rectifying junction.

The titanium-silicon rectifying junction has excellent forward and reverse characteristics. The reverse breakdown voltage is about 2 volts at 100 microamperes which compares favorably with a comparable molybdenum-silicon rectifying junction having a reverse breakdown voltage of about 10 to 15 volts at 100 microamperes. The forward characteristics of a titanium-silicon rectifying junction are shown in FIG. 3 as compared to a molybdenum-silicon rectifying junction. The forward current $I_f$ is shown as the ordinate and the forward voltage $V_f$ is shown as the abscissa of the graph. The $I_f$ of curve 30 resulting from test data taken on the titanium-silicon diode fabricated as shown in FIG. 1 increases from 0 to about 1 milliamphere as the $V_f$ is increased from 0 to about 0.2 volt. The $I_f$ of curve 31 resulting from test data taken on a comparable molybdenum-silicon diode does not increase from 0 to about 1 milliamphere until $V_f$ is increased from 0 to about 0.5 volt. The $V_f$ of curve 30 at 10 milliamperes is about 0.3 volt as compared to a $V_f$ of curve 31 of about 0.8 volt at 10 milliamperes. The improved forward characteristic of the titanium-silicon diode represented by the curve 30 as compared to the molybdenum-silicon diode as represented by the curve 31 is clearly shown by comparing their respective junction resistances, or the slopes of the curves. The junction resistance $R_j$ of the curve 30 at about 10 milliamperes is from 4 to about 6 ohms. The junction resistance $R_j$ of the curve 31 at about 10 milliamperes is about 7 to about 10 ohms. The reason for the difference in the series resistance of the titanium-silicon diode versus the molybdenum-silicon diode is not clearly understood. It is believed, however, to be somewhat related to the work factor of titanium, molybdenum and silicon, the work factor being defined as the energy required to move an electron from the Fermit level of a material.

The combination of low series resistance, resulting from the removal of the silicon oxide layer formed at the titanium-silicon interface and low forward voltage results in a rectifying junction that is ideal for a mixer diode to be used at microwave frequencies as well as for a general purpose diode.

While the invention has been described with a reference to a specific embodiment, it is to be understood that various changes, substitutions and changes may be made therein without departing from the spirit and scope of the invention as defined by the appended claims.

What is claimed is:

1. A Schottky-barrier metal semiconductor diode comprising in combination:

a. a semiconductor substrate of N+ conductivity type in which selected regions have been converted to N++ type;
b. an epitaxial region formed on the surface of said semiconductor substrate;
c. an insulating layer selectively covering said substrate, with first openings in said insulating layer exposing said epitaxial region and second opening exposing said N++ regions;
d. first titanium layers extending through said second openings ohmically contacting said N++ regions; and
e. a second titanium layer (thereby forming a Schottky-barrier) extending through said first openings engaging said epitaxial region in a rectifying metal semiconductor-diode contact.

2. A low-resistance Schottky-barrier diode comprising:

a. a silicon substrate having a first region of relatively low conductivity epitaxial silicon and a second region of relatively high conductivity silicon;
b. an insulating layer selectively covering said substrate, with a first opening in said insulating layer exposing said epitaxial region and a second opening exposing said relatively high conductivity second region of said silicon substrate;
c. a first layer of titanium extending through said first opening and engaging (a) said first region of said silicon substrate in rectifying contact, said titanium layer forming a low-resistance Schottky-barrier junction with said first region of said silicon substrate; and
d. a second layer of titanium extending through said second opening and ohmically contacting (a) said second region of said silicon substrate to form a low-resistance ohmic junction with said second region of said silicon substrate.

3. A low-resistance Schottky-barrier diode comprising:

a. a semiconductor substrate of N+ conductivity type comprising a first region formed of an epitaxial layer of N-type conductivity;
b. a first layer of titanium engaging said first region of said silicon substrate in rectifying contact, said titanium layer forming a low-resistance Schottky-barrier junction with said first region of said silicon substrate; and
c. a second layer of titanium ohmically engaging a second region of said silicon substrate to form a low-resistance ohmic junction with said second region of said silicon substrate, said second region having an N++ conductivity type.

* * * * *